(12) United States Patent
Zou

(10) Patent No.: US 7,622,981 B2
(45) Date of Patent: Nov. 24, 2009

(54) SQUARE CELL HAVING WIDE DYNAMIC RANGE AND POWER DETECTOR IMPLEMENTING SAME

(75) Inventor: Min Z. Zou, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 46 days.

(21) Appl. No.: 11/634,113

(22) Filed: Dec. 6, 2006

(65) Prior Publication Data
US 2008/0136491 A1 Jun. 12, 2008

(51) Int. Cl.
*G06G 7/20* (2006.01)
(52) U.S. Cl. ........................................ 327/349; 327/356
(58) Field of Classification Search ......... 327/355–361, 327/346–350, 378, 513; 455/326, 333
See application file for complete search history.

(56) References Cited

U.S. PATENT DOCUMENTS

| 3,315,162 A | 4/1967 | Liddle |
| 4,046,961 A | 9/1977 | Brown |
| 5,581,211 A * | 12/1996 | Kimura ........................ 327/356 |
| 6,087,883 A * | 7/2000 | Gilbert ........................ 327/355 |
| 6,097,883 A * | 8/2000 | Dell et al. .................... 710/301 |
| 6,297,685 B1 * | 10/2001 | Ewen et al. .................. 327/513 |
| 6,456,141 B1 * | 9/2002 | Nishizono et al. ........... 327/345 |
| 6,525,601 B2 * | 2/2003 | Gilbert ........................ 327/560 |

OTHER PUBLICATIONS

Communication Relating to the Results of the Partial International Search for Patent Application No. PCT/US2007/02290 dated on Jun. 10, 2008.

* cited by examiner

*Primary Examiner*—Dinh T. Le
(74) *Attorney, Agent, or Firm*—McDermott Will & Emery LLP

(57) ABSTRACT

A square cell comprises first and second bipolar transistors each having an emitter, collector and base, the bases of the transistors being connected for receiving an input voltage, and first and second resistors in series with the first and second bipolar transistors respectively and with a source of reference voltage. The collectors are commonly connected to an output node to supply an output current having a component proportional to the square of the input voltage. Enhanced square law conformance may be produced by adding further pairs of bipolar transistors to the cell, with offset voltage elements coupled between bases of successive transistors on each side of the cell.

12 Claims, 7 Drawing Sheets

SQUARE CELL HAVING WIDE DYNAMIC RANGE AND POWER DETECTOR IMPLEMENTING SAME

TECHNICAL FIELD

The subject matter of this disclosure relates generally to square cell architectures, and more particularly to a novel low power, high speed square cell having broad dynamic range. The square cell has particular utility in, but is not limited in application to, power detection circuitry.

BACKGROUND

Measurement of high speed signal strength often is required in wireless communication systems. A circuit commonly used for this purpose is an RMS-to-DC converter. Signal strength is measured by a detector using a square cell. An application of such a detector is described in my copending application Ser. No. 11/493,528, filed on Jul. 26, 2006, and titled "Low Power Wide Dynamic Range RMS-to-DC Converter, assigned to the common assignee and incorporated herein by reference. FIG. 1 shows an open-loop power detector of a general type implemented in the co-pending application. The power measurement of an input signal can be best described in the following equation (1), where a square cell is needed before average power determination is performed.

$$V_{out} = \frac{1}{T}\int_0^T I_{out}\,dt * R \qquad (1)$$
$$= K_1 * \frac{1}{T} * \int_0^T V_{in}^2\,dt * R$$
$$= K_2 * P_{in}$$

To provide a signal strength measurement that is independent of any particular input signal being processed, the detector should be insensitive to input waveforms, even those with high crest factor, or peak amplitude divided by RMS value.

Optimal operation is dependent upon several factors. Precision measurement of input signal regardless of its waveform over a wide dynamic range of the input signal power is an important consideration. Fast envelope detection of a modulated input signal is advantageous in obtaining an output that is independent of input signal waveform. Linear input impedance as a function of input power is needed to avoid distortion back to the signal source. As systems often may be subject to considerable temperature variations, stable output should be maintained across the operating temperature range of the circuit. Low DC power consumption, of course, also is an important objective. Accordingly, a square cell having these desirable characteristics is needed for the application described as well as for other applications.

SUMMARY OF DISCLOSURE

To achieve the above described desirable characteristics, a square cell as taught herein comprises first and second bipolar transistors, in which base electrodes are connected for receiving an input voltage, and first and second resistors are in series with the first and second bipolar transistors, respectively, and with a source of reference voltage. The collectors of the transistors are commonly connected to an output node of the cell to supply an output current having a current component proportional to the square of the input voltage.

The first and second resistors may be emitter degeneration resistors connected between the emitter electrodes of the transistors and source of reference voltage. A bias circuit, that may include a dummy cell replicating a DC bias current component of the cell, may be provided for supplying a temperature compensated bias voltage to the first and second transistors.

To improve square law conformance, the cell may include third and fourth bipolar transistors having base electrodes coupled respectively through offset voltage elements, to the base electrodes of the first and second bipolar transistors. Collector electrodes of the third and fourth transistors are commonly connected to the collector electrodes of the first and second transistors. Third and fourth resistors may be connected in series respectively with the third and fourth transistors and the source of reference voltage.

The cell may be generalized as follows: The cell may comprise k (k≧1) mutually opposed bipolar transistor pairs, the base electrodes of the first pair among the k pairs of transistors being connected for receiving an input voltage; and first and second resistors in series respectively with the transistors and with a source of reference voltage. The collectors are commonly connected to an output node to supply an output current having a current component proportional to the square of the input voltage. Offset voltage elements are coupled between the base electrodes of successive transistors on each side of the cell.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

DETAILED DESCRIPTION

The subject matter herein is a low power, high speed square cell implemented in the form of a pair of bipolar transistors, in grounded emitter configuration preferably with emitter degeneration resistance, with collectors commonly connected at a current output node and bases connected to receive an input voltage together with a common mode (quiescent) biasing voltage. When the amplitude of the input voltage is less than the threshold voltage of the bipolar transistors, the output current comprises a DC quiescent current together with a component that is proportional to the square of the input voltage. As the amplitude of the input voltage increases above the threshold voltage, emitter degeneration of the common emitter stages dominates and the output current becomes linearly proportional to input voltage. The dynamic range of the cell can be expanded using multiple pairs of bipolar transistors, in which successive transistors at each side of the cell are separated by a prescribed base offset voltage.

Figure 1:
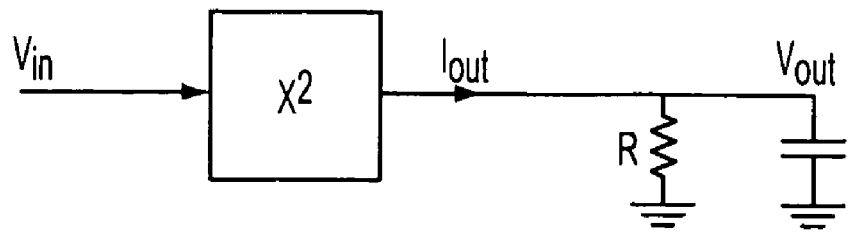
FIG. 1 is a drawing showing symbolically a square circuit in an open loop power detector conventionally used.
Figure 2:
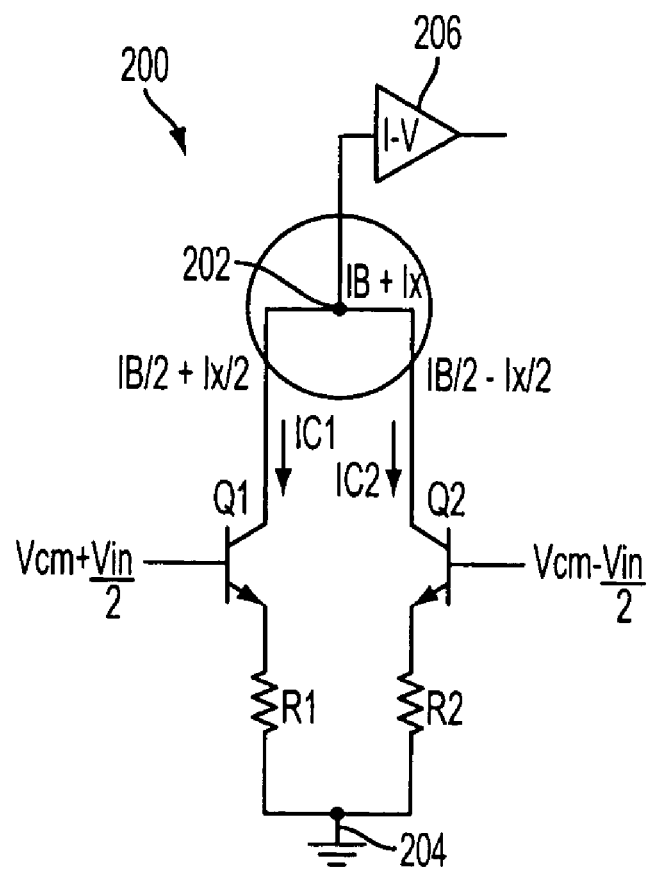
FIG. 2 is a circuit diagram showing a square cell in accord with the current teachings.

Referring to FIG. 2, square cell 200 is formed as a pair of bipolar transistors Q1, Q2 (NPN transistors in this example) on opposite sides of the cell between a current output node 202 and reference voltage source 204, which may be ground. The transistors Q1, Q2 have collectors that are commonly connected at output node 202, and emitters connected to ground through emitter degeneration resistors R1, R2.

To the bases of transistors Q1 and Q2, respectively, are applied the positive and negative portions of input voltage $V_{in}$, together with a common quiescent or bias (DC) voltage $V_{CM}$ to drive the two transistors to prescribed operating points. Although in the preferred implementation, the collectors of Q1, Q2 are connected directly to common output node 202, relatively small resistors could be interposed in the collector circuits without significant deleterious effects, that is, without departure from square law transformation by the cell.

The operation of square cell 200 may be understood with reference to the following equations, in which $I_B$ output dc quiescent current, $I_s$ is transistor saturation current and $I_x$ is signal current.

When $I_{c1} * R1$ or $I_{c2} * R2 \ll Vt$, ($R1 = R2 = R$)

$$I_{c1} = I_s \cdot e^{(Vcm+Vin/2)/Vt} = \frac{1}{2} * I_B \cdot e^{Vin/2Vt} \quad (2)$$

$$I_{c2} = I_s \cdot e^{(Vcm-Vin/2)/Vt} = \frac{1}{2} * I_B \cdot e^{-Vin/2Vt} \quad (3)$$

Therefore, $$I_{OUT} = I_B \cdot (e^{Vin/2Vt} + e^{-Vin/2Vt})$$

$$= I_B * \left\{ 1 + \frac{1}{2} * \left(\frac{Vin}{2Vt}\right)^2 + \frac{1}{24} * \left(\frac{Vin}{2Vt}\right)^4 + \right. \quad (4)$$

$$\left. = \text{higher order} \right\}$$

$$I_x \approx \frac{1}{2} * I_B * \left(\frac{Vin}{2Vt}\right)^2 \quad (5)$$

$$I_{OUT} = I_B + I_x \approx I_B + \frac{1}{2} * I_B * \left(\frac{Vin}{2Vt}\right)^2 \quad (6)$$

where $Vt = kT/q$

Assuming that degeneration resistors R1 and R2 are equal in value and that the voltage drop across these resistors is substantially less than the threshold voltage $V_t$ of transistors Q1, Q2, collector currents $I_{c1}$ and $I_{c2}$ are given by equations (2) and (3). The output current at node 200 is the sum of $I_{c1}$ and $I_{c2}$, expressed in equation (4), or the sum of a DC current component $I_B$, a component Ix that is a square of the input voltage, and higher order components (that can be ignored).

When the input voltage Vin is less than the threshold Vt of transistors Q1, Q2, the output current of cell 200 is generally proportional to the square of the input voltage. As the amplitude of the input voltage Vin increases above threshold Vt, the output current becomes substantially linear as a function of input voltage as degeneration by emitter resistors R1, R2 eventually dominates. That is, $$I_{out} \approx I_x \approx V_{in}/R, \text{ when } I_{c1}*R1 \text{ or } I_{c2}*R2 \gg V_t \quad (7)$$

Figure 3A:
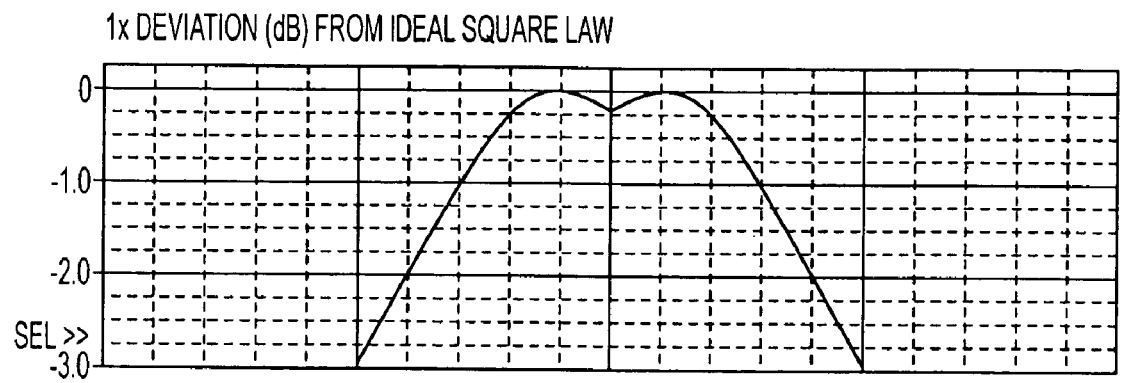
FIGS. 3A and 3B are graphs showing respectively output current versus input voltage in the square cell depicted in FIG. 2, and deviation from ideal square law performance.
Figure 3B:
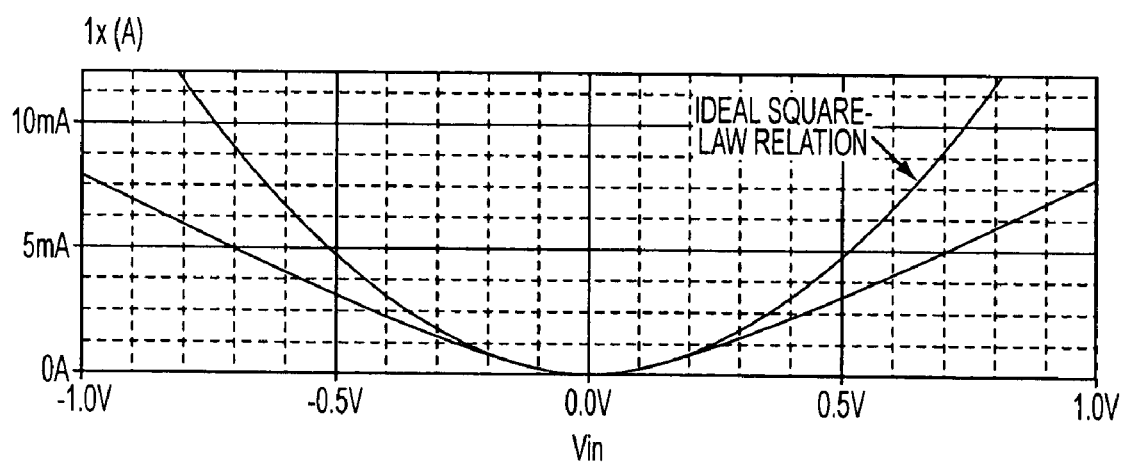

This characteristic is shown in FIG. 3B in which a first (lower) curve describes output current as a function of input voltage and a second (upper) curve shows the idea square response, FIG. 3A shows the deviation of output current from an ideal square law relationship between them. The graph demonstrates that the output of square cell 200 is an accurate replica of the square of input voltage up to about 200 millivolts (absolute); thereafter, the output current is substantially linearly proportional to input voltage.

Base current $I_B$ may be best-fitted into the square law relationship by selection of values of resistors R1 and R2. In addition it is desirable to minimize $I_B$ so as to minimize power consumption and DC component at the output of the cell. The output of cell 200 after averaging is largely DC with a relatively small signal component. For a small input signal, this output signal component may be undesirably small. It is preferable in many applications to add a transimpedence amplifier 206 at the output of square cell 200 shown in FIG. 2 to convert the output current into a corresponding voltage of greater magnitude. Since the output dc current is inversely proportional to the absolute temperature, it is desirable for this transimpedence amplifier to have a gain proportional to absolute temperature. Therefore, the dc output voltage will be independent of temperature. In addition, as a lower DC quiescent current will reduce DC offset voltage, it is possible to more accurately distinguish average squared output from DC offset to improve the dynamic range of the cell.

Referring again to FIG. 3B (lower curve), the output current of cell 200 will generally follow a straight line defined by $V_{in}/R$ while $V_{in}$ exceeds 200 millivolts, as explained previously. When $V_{in}$ (absolute) is greater than 200 millivolts, the output signal component $I_x$ will deviate from square law transformation, as illustrated in FIG. 3A. However, this deviation itself has an exponential characteristic.

Figure 4:
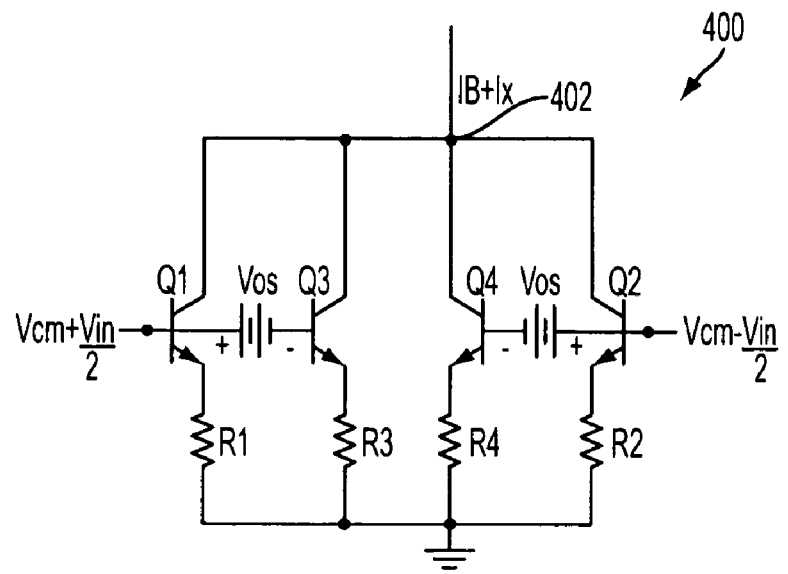
FIG. 4 is a circuit diagram of the square cell of FIG. 2, with additional stage pairs for extended range.

In accord with the teachings herein, the dynamic range of cell 200 is expanded by carrying out higher order correction so that deviation from ideal square law is corrected to achieve more accurate square law transformation of the cell. FIG. 4 shows a cell implementation 400, in which to carry out this further correction another pair of stages Q3, Q4 is added, with an offset voltage $V_{os}$ (200 millivolts in the example) imposed between successive stages on each side of the cell. The first pair of bipolar transistors Q1, Q2 (corresponding to Q1, Q2 in FIG. 2) has its collectors connected to output current node 402 and emitters connected, through emitter resistors R1, R2, to ground. The added transistor pair Q3, Q4 is connected between output node 402 and ground through emitter degeneration resistors R3, R4. Offset voltage $V_{OS}$ elements are coupled between bases of successive transistors Q1, Q3 on one side of the cell, as shown, and similarly offset voltage $V_{OS}$ elements are coupled between transistors Q2 and Q4 on the opposite side of the cell. The input voltage is applied to transistors Q1 and Q2.

When $V_{in}$ is much less than 200 millivolts, transistors Q1, Q2 and resistors R1, R2 which form the square cell of FIG. 2, perform as described previously. Transistors Q3, Q4 are not conducting current and do not contribute to the total output current at node 402 because those transistors are maintained off by a voltage drop in the amount $V_{OS}$ imposed between those transistors. However, as increasing $V_{in}$ approaches 200 millivolts, transistor Q3 begins to conduct. At this time, the voltage at the base of transistor $Q_4$ is much less than ($V_{cm}$–200 millivolts), and transistor Q4 is maintained off. Resistor R3 is of value to fit square law transformation.

In the opposite direction of change of input voltage, as $V_{in}$ decreases, and approaches 200 millivolts, transistor Q4 now starts to conduct, and the emitter degeneration resistor R4 (=R3) is used to fit square law transformation. Since the voltage at the base of transistor $Q_3$ is much less than ($V_{cm}$–200 millivolts), transistor Q3 is maintained off. The contribution of transistor pair Q3, Q4 to output current accordingly corrects for second order variance from square law transformation performed by cell 400.

Figure 5:
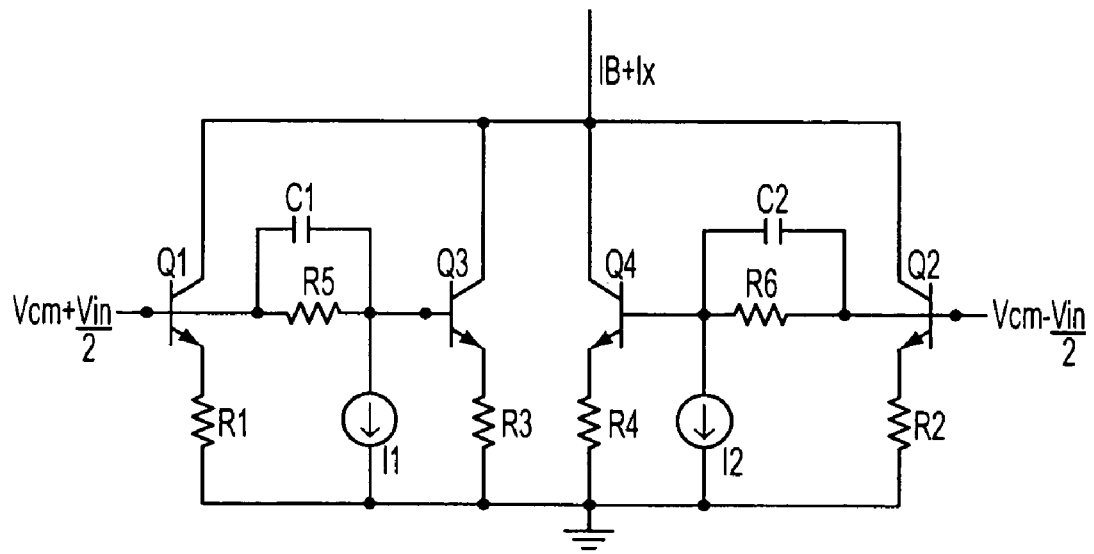
FIG. 5 is a more detailed circuit diagram showing implementation of offset voltage elements between stages.

FIG. 5 shows a circuit implementation of the cell 400 of FIG. 4, in which $V_{OS}$ is configured by resistor R5 between transistors Q1 and Q3 and resistor R6 between transistors Q4 and Q2, together with current sources I1 and I2, respectively producing voltage drops $V_{OS}$ across the resistors. However, resistors R5 and R6 tend undesirably to introduce an RC time constant into the frequency response of the cell associated with transistors Q3 and Q4. As a result, as input frequency increases, the square law relationship performed by the cell will tend to degrade. To improve frequency response, capacitor C1 and C2 are connected across resistors R5 and R6 to AC couple the input signal directly to transistors Q3 and Q4.

Figure 6A:
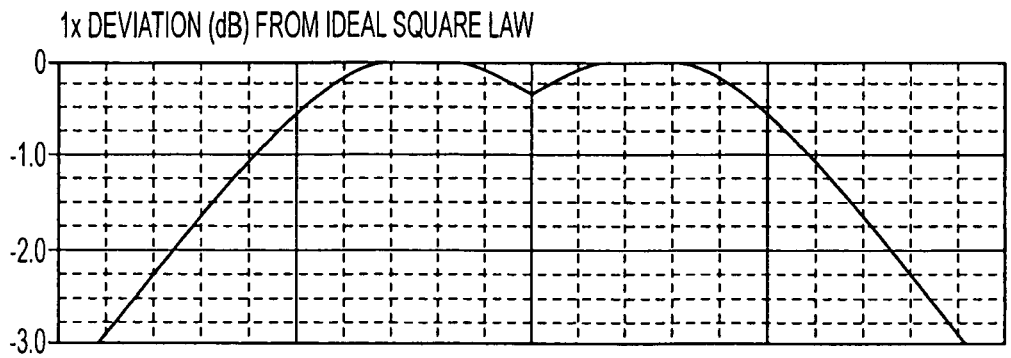
FIGS. 6A and 6B are graphs corresponding respectively to FIGS. 3A, 3B, for the extended range cell of FIG. 5.
Figure 6B:
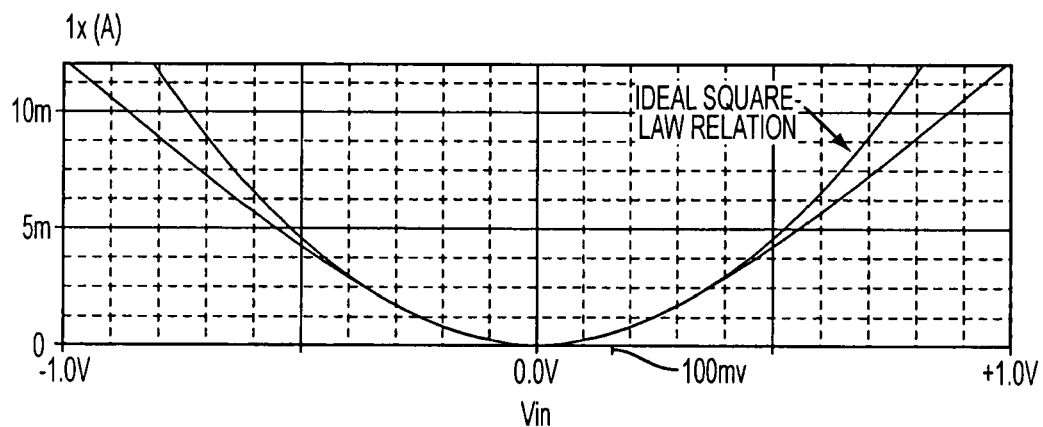

The output current of cell 400 satisfies the square function within one dB error for input voltage up to 293 millivolts for the square cell 200 shown in FIG. 2. When Q3 and Q4 are added, per FIG. 4, the input voltage range is extended to 576 millivolts within the same output error, shown graphically in FIG. 6B. As a result, square law conformance is extended by 5.7 dB. This technique can be expanded to further improve square law conformance by adding further transistor pairs to the square cell. Since the inputs of the cell, configured as shown, are at very high impedance, little distortion is generated at the input and feedback to the signal source when the cell is terminated with a 50 ohm resistor for impedance matching to a 50 ohm source (in this example).

Figure 7:
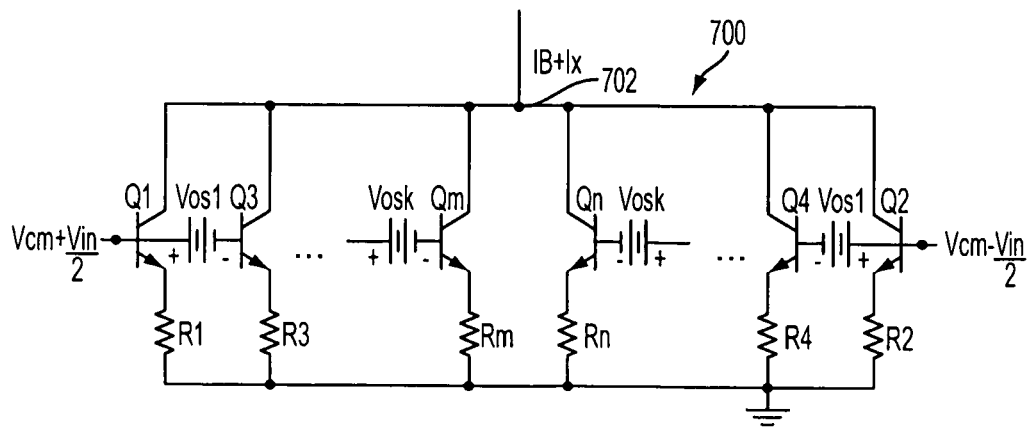
FIG. 7 is a circuit diagram showing a wide range square cell having k pairs of opposed transistor pairs.

Referring next to FIG. 7, the previously described square cell can be generalized to any number of bipolar transistor pair stages. FIG. 7 shows a wide range square cell embodiment, in which k bipolar transistor pairs are implemented, and in which transistors Q1 and Q2 are the first pair that receives the input voltage $V_{in}$ and common node voltage Vcm. The left hand side of the square cell 700 in FIG. 7 contains transistors Q1, Q3, ... $Q_m$, with collectors commonly connected to the output node 702 and emitters connected through resistors R1, R3, ... $R_m$) to ground. Offset voltage elements $V_{os1}$ ... $V_{osk}$) with polarity shown are connected between bases of successive transistors on that side of the cell. Similarly, on the right hand side of the circuit are transistors Q2, Q4, ... Qn, with collectors commonly connected to the output node 702, emitters connected through emitter degeneration resistors R2, R4, ... Rn to ground. Offset voltage elements $V_{os1}$ ... $V_{osk}$ with polarity shown are connected between bases of successive transistors on that side of the cell. The emitter degeneration resistors R1 ... Rm and R2 ... Rn can be optimized for best square law conformance.

Figure 8A:
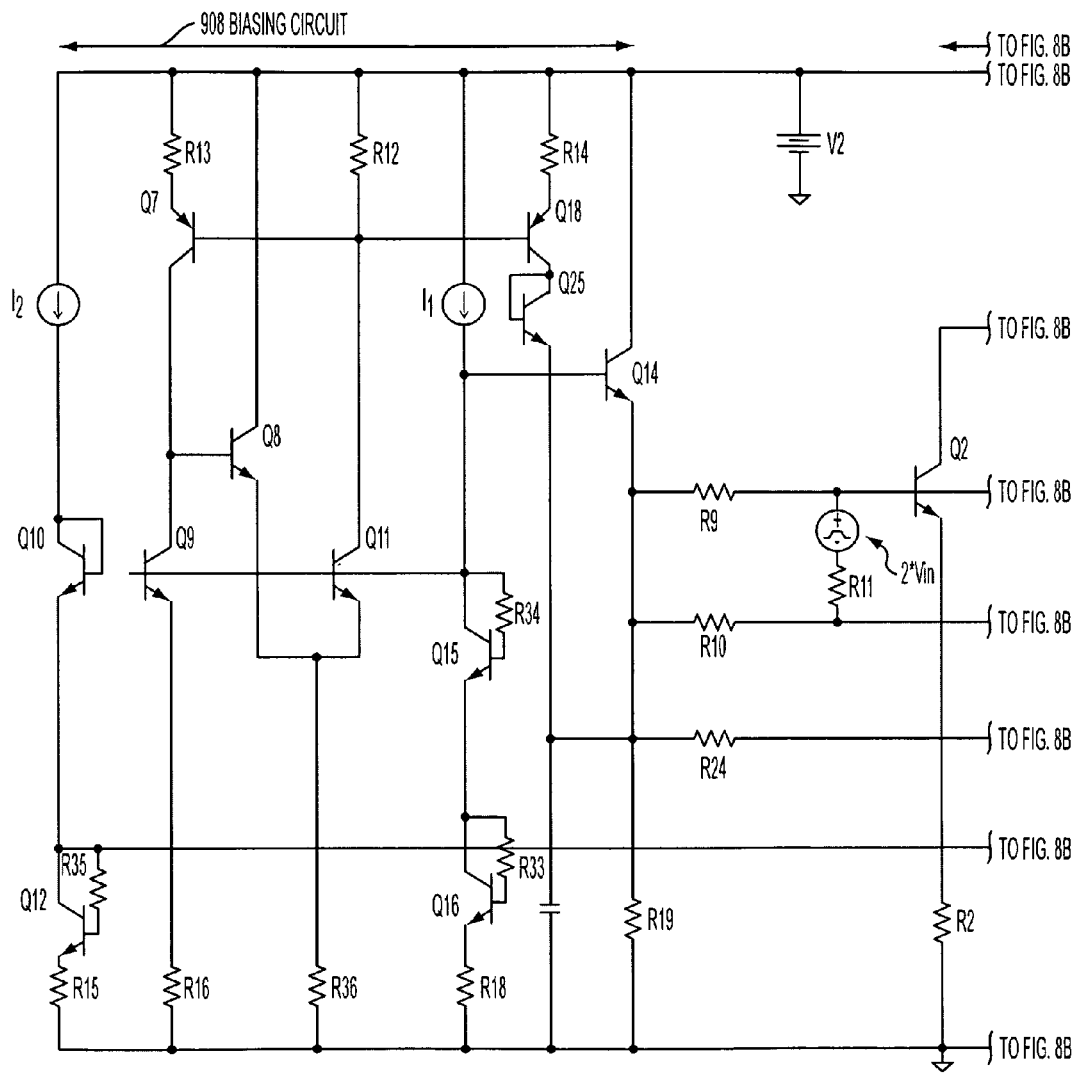
FIGS. 8A and 8B are a circuit diagram showing a detailed implementation of FIG. 7.
Figure 8B:
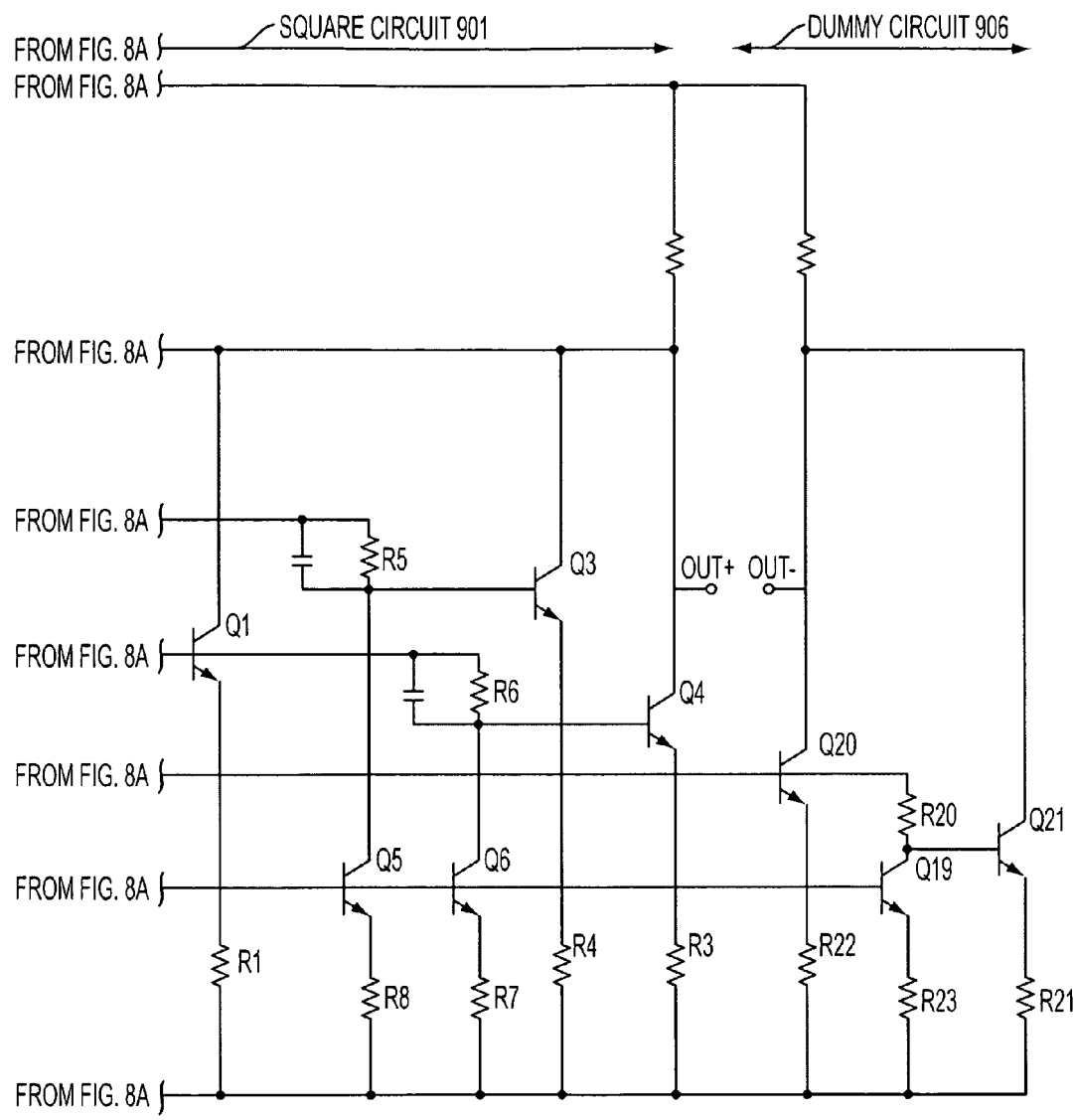

When PTAT (proportional to absolute temperature) quiescent currents are used for the square cell implementations described previously, the output current signal $I_x$ is inversely proportional to $V_t(kT/q)$. This can be implemented by scaling the output of the square cell proportionally to absolute temperature. FIGS. 8A, 8B is a more detailed circuit diagram in which square circuit 801 and dummy circuit 806 are shown, with designations corresponding to those of previously described. Biasing circuit 808 produces the DC quiescent current $V_{cm}$ applied to the input of the square cell. Current source I2 is a PTAT source producing current that flows through diode Q10 and transistor Q12, and similarly current source I1 is a PTAT current source supplying current to transistors Q15 and Q16. Current source 12 is used in a translinear loop including transistors Q1 and Q2 (the input transistor of the square cell), and transistors Q15 and Q16 together with transistor Q14. This produces a desirable PTAT current through transistors Q1 and Q2. Transistor Q14 is an emitter follower to minimize base current to drive Q1 and Q2. Current source 12, supplying current to Q12, biases transistors Q5, Q6 which provides current sources corresponding to current sources I1, I2 in FIG. 5. Resistor R11 (50 ohms, for example) is a source resistance for $V_s$ ($2*V_{in}$). R9-R10 (25 ohms) are input matching resistors for a 50 ohm source (R9+R10=50 ohms).

Figure 9:
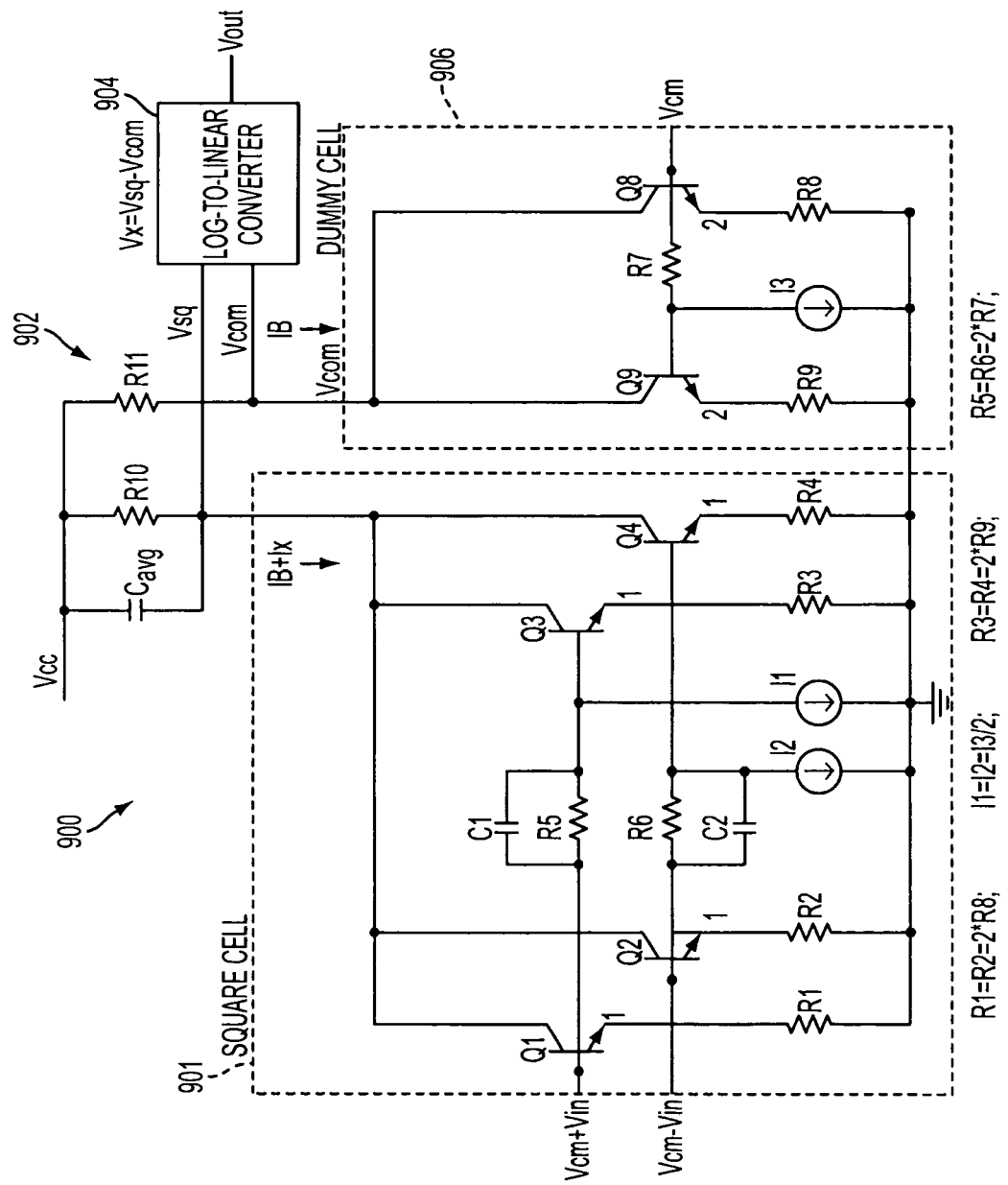
FIG. 9 is a circuit diagram showing am RMS-to-DC converter implementing a square cell per the teachings herein.

The square cell described herein can be used either for open-loop or closed loop power detection. FIGS. 8A, 8B show application of a two stage square cell, described in FIG. 4, in a power detector circuit 800. In the copending '528 application identified previously, a successive method was implemented for extended dynamic range. In FIG. 9, a square cell 901 in accord with the teachings herein is used in the power detector circuit 900 of that application. Power detector circuit 900 implements square cell 901, of configuration shown in FIG. 5, details of which will not be repeated. The output of square cell 901 is applied to an averaging circuit 902 and to one input of a log-to-linear converter 904, as described in the copending application. The output averaging circuit 902 is a DC current $I_B$ together with signal component $I_x$ that is the square of the input voltage, as described previously. The DC quiescent current $I_B$ is substantially canceled by a counterpart quiescent current Vcomp at an inverting input of log-to-linear converter 904, generated by a dummy cell 906. The dummy cell 906 is DC biased with transistors Q8, Q9, offset voltage element R7, R3 and emitter degeneration resistors R8, R9 that comport with those of the square cell. The dummy cell 906 accordingly will generate precisely the same DC quiescent current $I_B$ as the square cell, independent of power supply and temperature variations. After subtraction at converter 904, the net output current (or output voltage if a transimpledance amplifier is implemented) to the log-to-linear converter 904 will be only Ix (or Vx), the signal component.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention.

Accordingly, the description is not intended to limit the invention to the form disclosed herein. Also, it is intended that the appended claims be construed to include alternative embodiments.

What is claimed is:

1. A square cell, comprising:
   first and second bipolar transistors each having an emitter, collector and base, the bases of the transistors being connected for receiving an input voltage; and
   first and second resistors at one end connected in series respectively with the first and second bipolar transistors and, at the other end, directly to a common source of reference voltage;
   the collectors being commonly connected to an output node thereby to supply an output current having a component proportional to the square of the input voltage when the input voltage is of a magnitude less than a threshold voltage of the transistors, and
   including a bias circuit having a PTAT current source coupled to control electrodes of the first and second transistors for supplying a temperature compensated bias voltage thereto.

2. A square cell as recited in claim 1, wherein the input voltage is of magnitude less than the threshold voltage of the transistors throughout an input voltage swing.

3. A square cell, comprising:
   first and second bipolar transistors each having an emitter, collector and base, the bases of the transistors being connected for receiving an input voltage; and
   first and second resistors at one end connected in series respectively with the first and second bipolar transistors and, at the other end, directly to a common source of reference voltage;
   the collectors being commonly connected to an output node thereby to supply an output current having a component proportional to the square of the input voltage when the input voltage is of a magnitude less than a threshold voltage of the transistors,
   including a bias circuit coupled to control electrodes of the first and second transistors for supplying a temperature compensated bias voltage thereto, and
   wherein the bias circuit includes a dummy cell configured for replicating a DC quiescent current of the cell for biasing the cell when operating power is supplied thereto.

4. A square cell, comprising:
   first and second bipolar transistors each having an emitter, collector and base, the bases of the transistors being connected for receiving an input voltage; and
   first and second resistors at one end connected in series respectively with the first and second bipolar transistors and, at the other end, directly to a common source of reference voltage;
   the collectors being commonly connected to an output node thereby to supply an output current having a component proportional to the square of the input voltage when the input voltage is of a magnitude less than a threshold voltage of the transistors, and
   including third and fourth bipolar transistors each having a base coupled, respectively, through offset voltage elements to the bases of the first and second bipolar transistors, collectors commonly connected to the collectors of the first and second transistors, and third and fourth resistors in series respectively with the third and fourth transistors and the source of reference voltage,
   wherein the offset elements are resistors and associated current sources to produce the offset voltage.

5. A square cell, comprising:
   first and second bipolar transistors each having an emitter, collector and base, the bases of the transistors being connected for receiving an input voltage; and
   first and second resistors at one end connected in series respectively with the first and second bipolar transistors and, at the other end, directly to a common source of reference voltage;
   the collectors being commonly connected to an output node thereby to supply an output current having a component proportional to the square of the input voltage when the input voltage is of a magnitude less than a threshold voltage of the transistors, and
   including third and fourth bipolar transistors each having a base coupled, respectively, through offset voltage elements to the bases of the first and second bipolar transistors, collectors commonly connected to the collectors of the first and second transistors, and third and fourth resistors in series respectively with the third and fourth transistors and the source of reference voltage,
   wherein the offset elements are resistors and associated current sources to produce the offset voltage, and
   including capacitors across the resistor offset elements to AC couple the input signal between transistors.

6. A square cell as recited in claim 5, wherein the input voltage is of magnitude less than the threshold voltage of the transistors throughout an input voltage swing.

7. A square cell as recited in claim 5, wherein the first and second resistors are emitter degeneration resistors connected between the transistor emitters and a source of reference voltage.

8. A power detector circuit, comprising:
   first and second bipolar transistors each having an emitter, collector and base, the bases of the transistors being connected for receiving an input voltage; and
   first and second resistors at one end connected in series respectively with the first and second bipolar transistors and, at the other end, directly to a common source of reference voltage;
   the collectors being commonly connected to an output node thereby to supply an output current having a component proportional to the square of the input voltage when the input voltage is of a magnitude less than a threshold voltage of the transistors; and
   a log-to-linear converter coupled to the output of the square cell.

9. A square cell as recited in claim 8, wherein the input voltage is of magnitude less than the threshold voltage of the transistors throughout an input voltage swing.

10. A square cell as recited in claim 8, wherein the first and second resistors are emitter degeneration resistors connected between the transistor emitters and a source of reference voltage.

11. A power detector circuit, comprising:
    a square cell comprising:
       first and second bipolar transistors each having an emitter, collector and base, the bases of the transistors being connected for receiving an input voltage,
       first and second resistors at one end connected in series respectively with the first and second bipolar transistors and, at the other end, directly to a common source of reference voltage,
       the collectors being commonly connected to an output node thereby to supply an output current having a component proportional to the square of the input voltage when the input voltage is of a magnitude less than a threshold voltage of the transistors, and
       a bias circuit for supplying a temperature compensated bias voltage to the first and second transistors, wherein the bias circuit includes a dummy cell configured for replicating a DC quiescent current of the cell; and a log-to-linear converter coupled to the output node of the square cell and the dummy cell.

12. A square cell, comprising:

k (k≧2) bipolar transistor pairs, each transistor having an emitter, collector and base, the bases electrodes of the first pair among the k pairs of transistors being connected for receiving an input voltage; and first and second resistors at one end connected in series respectively with each transistor and, at the other end, directly to a common source of reference voltage;

offset voltage elements coupled between bases of successive bipolar transistors;

the collectors all being commonly connected to an output node thereby to supply an output current having a component proportional to the square of the input voltage when the input voltage is of a magnitude less than a threshold voltage of the transistors, including a bias circuit for supplying a temperature compensated bias voltage to the first and second transistors, and wherein the bias circuit includes a dummy cell configured for replicating a DC quiescent current of the cell.

\* \* \* \* \*